United States Patent
Chen

(10) Patent No.: US 10,568,241 B1
(45) Date of Patent: Feb. 18, 2020

(54) SHIELDING BOX, RADIO FREQUENCY SIGNAL ATTENUATION SYSTEM, AND METHOD OF APPLYING SYSTEM

(71) Applicant: FIH (HONG KONG) LIMITED, Kowloon (HK)

(72) Inventor: Chien-Wei Chen, New Taipei (TW)

(73) Assignee: FIH (HONG KONG) LIMITED, Kowloon (HK)

( * ) Notice: Subject to any disclaimer, the term of this patent is extended or adjusted under 35 U.S.C. 154(b) by 0 days.

(21) Appl. No.: 15/692,307

(22) Filed: Aug. 31, 2017

(30) Foreign Application Priority Data

Aug. 15, 2017 (CN) .......................... 2017 1 0697691

(51) Int. Cl.
| | |
|---|---|
| *H05K 9/00* | (2006.01) |
| *G01R 29/08* | (2006.01) |
| *H02K 11/01* | (2016.01) |
| *H02K 11/22* | (2016.01) |

(52) U.S. Cl.
CPC ........... *H05K 9/0007* (2013.01); *G01R 29/08* (2013.01); *H02K 11/01* (2016.01); *H02K 11/022* (2013.01); *H05K 9/0056* (2013.01); *H05K 9/0073* (2013.01); *H05K 9/0088* (2013.01)

(58) Field of Classification Search
CPC ........................... H05K 9/0007; H05K 9/0088
See application file for complete search history.

(56) References Cited

U.S. PATENT DOCUMENTS

| | | | | |
|---|---|---|---|---|
| 6,869,683 B2* | 3/2005 | Sakurai | ................... | B32B 25/20 428/447 |
| 7,495,181 B2* | 2/2009 | Matsushita | ............ | H01Q 17/00 174/377 |
| 7,551,117 B2* | 6/2009 | Asaba | ....................... | B32B 5/18 342/1 |
| 9,972,913 B2* | 5/2018 | Kato | .................... | H01Q 17/005 |
| 2007/0196671 A1* | 8/2007 | Kobayashi | ............. | B82Y 25/00 428/447 |
| 2009/0027300 A1* | 1/2009 | Kudo | ................... | H05K 9/0003 343/912 |
| 2010/0116543 A1* | 5/2010 | Ikeda | ...................... | B32B 27/08 174/388 |
| 2010/0214713 A1* | 8/2010 | Song | ........................ | B32B 3/26 361/220 |
| 2010/0294558 A1* | 11/2010 | Mitsui | .................. | H05K 9/0083 174/377 |
| 2013/0014984 A1* | 1/2013 | Iida | ...................... | H01Q 17/002 174/388 |
| 2013/0224023 A1* | 8/2013 | Kim | ........................ | B32B 37/24 416/146 R |
| 2014/0266850 A1* | 9/2014 | Suorsa | ................. | H05K 9/0088 342/1 |
| 2017/0002488 A1* | 1/2017 | Tanaka | ...................... | B32B 5/02 |

\* cited by examiner

*Primary Examiner* — Hung V Ngo
(74) *Attorney, Agent, or Firm* — ScienBiziP, P.C.

(57) ABSTRACT

A shielding box configured for regulating a transmission distance of a radio frequency (RF) signal of an electronic device is used as a container of the electronic device. The shielding box includes a box body. The box body includes a wave-absorbing layer, a first metal layer, a conductive fabric layer, a second metal layer, and a third metal layer in that order from inside to outside. An RF signal attenuation system and method are also provided.

15 Claims, 3 Drawing Sheets

SHIELDING BOX, RADIO FREQUENCY SIGNAL ATTENUATION SYSTEM, AND METHOD OF APPLYING SYSTEM

FIELD

The subject matter herein generally relates to wireless communications, and radio frequency (RF) signal shielding.

BACKGROUND

An effective shielding box should completely isolate radio frequency (RF) signals from an electronic equipment. When the electronic equipment is set in the shielding box, the electronic equipment should not be able to connect to a WiFi hotspot or a Bluetooth device.

BRIEF DESCRIPTION OF THE DRAWINGS

Implementations of the present technology will now be described, by way of example only, with reference to the attached figures.

DETAILED DESCRIPTION

Figure 1:
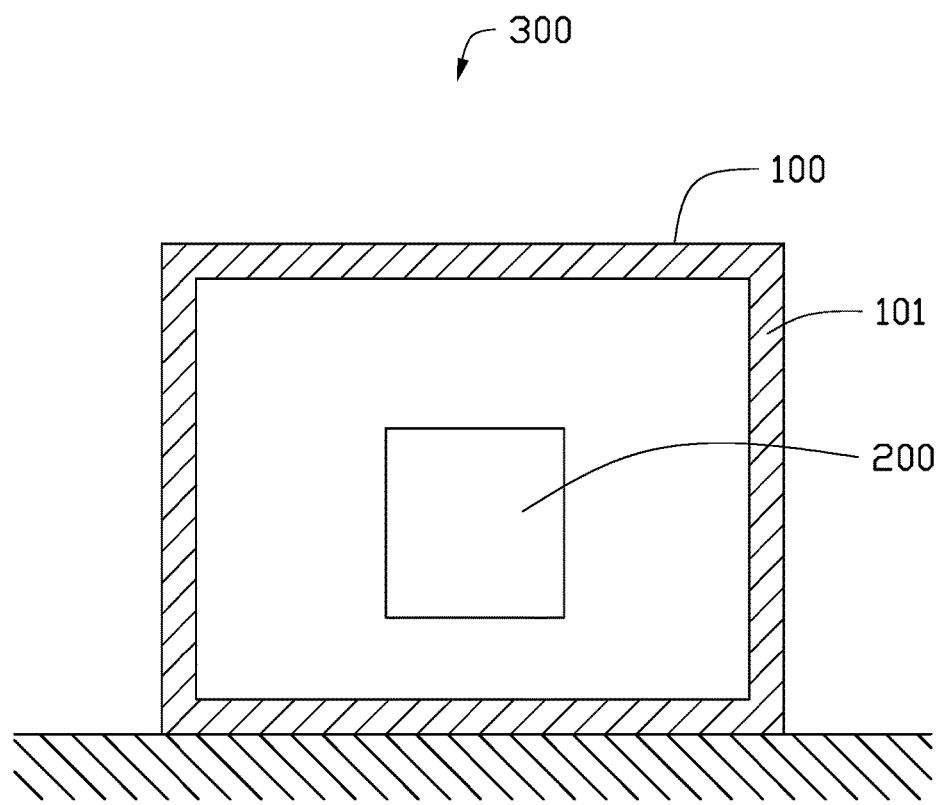
FIG. 1 is a diagram of an exemplary embodiment of an RF signal attenuation system.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure. It should be noted that references to "an" or "one" embodiment in this disclosure are not necessarily to the same embodiment, and such references mean "at least one".

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series, and the like.

FIG. 1 illustrates an RF signal attenuation system 300 in accordance with an exemplary embodiment.

The RF signal attenuation system 300 comprises a shielding box 100 and an electronic equipment 200. The shielding box 100 comprises a box body 101. The shielding box 100 can further comprise a box cover (not shown). The box cover also can be omitted. The electronic equipment 200 can be set in the shielding box 100. The electronic equipment 200 is capable of transmitting and receiving a radio frequency (RF) signal. When the electronic equipment 200 is set in the shielding box 100, the shielding box 100 can control a transmitting distance or a receiving distance of the RF signal of the electronic equipment 200.

In one exemplary embodiment, the shielding box 100 can be a cuboid box and the shielding box 100 entirely surrounds the electronic equipment 200. The box body 101 can comprise an opening surface (not shown) and the electronic equipment 200 can be set in the shielding box 100 through the opening surface.

Figure 2:
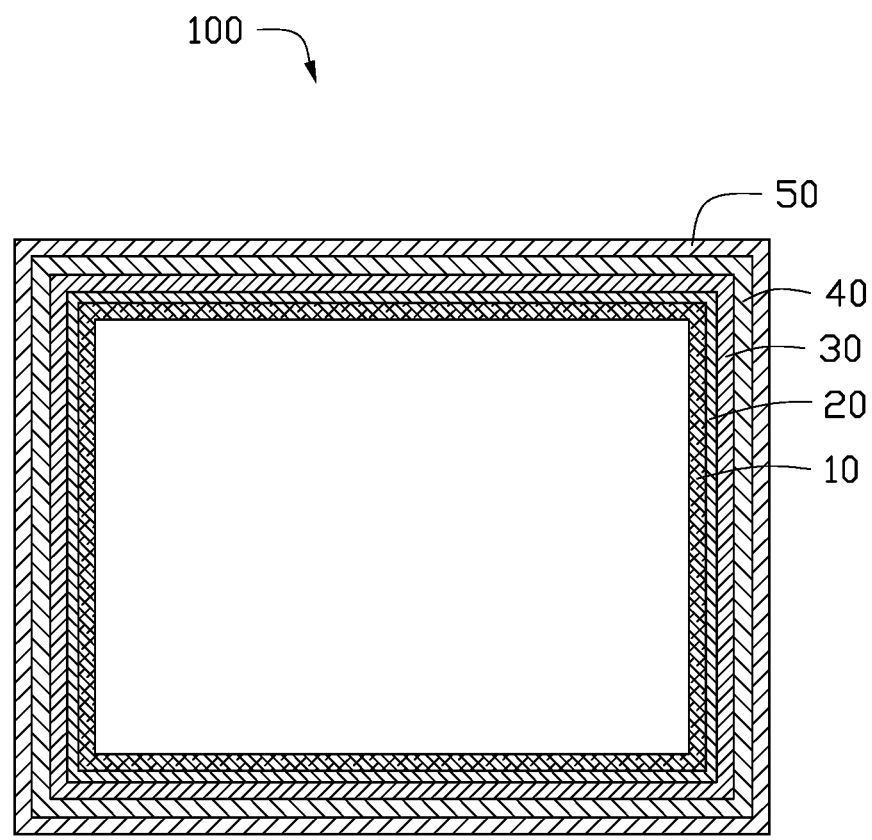
FIG. 2 is a structure diagram of an exemplary embodiment of a shielding box of the system of FIG. 1.

Referring to FIG. 2, the box body 101 comprises an wave-absorbing layer 10, a first metal layer 20, a conductive fabric layer 30, a second metal layer 40, and a third metal layer 50, from inside to outside in that order.

When the electronic equipment 200 transmits or receives an RF signal, the wave-absorbing layer 10 can absorb and refract the RF signal to reduce a transmission distance of the RF signal, and the first metal layer 20, the conductive fabric layer 30, the second metal layer 40, and the third metal layer 50 can further attenuate the RF signal to reduce the transmission distance of the RF signal. It should be noted that, in the present exemplary embodiment, the shielding box 100 attenuates the RF signals, instead of fully blocking the RF signals in and out of the electronic equipment 200, such that the shielding box 100 can transmit and receive RF signals through the shielding box 100.

In one exemplary embodiment, the first metal layer 20, the second metal layer 40, and the third metal layer 50 comprise metal materials of types which are different from one another.

In one exemplary embodiment, the wave-absorbing layer 10 can be a foam layer. The first metal layer 20 can be a copper foil layer. The second metal layer 40 can be an aluminum foil layer. The third metal layer 50 can be an iron sheet layer.

In one exemplary embodiment, the first metal layer 20 can be an aluminum foil layer. The second metal layer 40 can be a copper foil layer.

In one exemplary embodiment, the conductive fabric layer 30 can be a nickel-plated conductive fabric layer, a gold-plated conductive fabric layer, or a carbon-plated conductive fabric layer.

In one exemplary embodiment, the thickness of each of the layers 10 through 50 of the shielding box 100 can be adjusted to control the propagation distance of the RF signals transmitted or received by the electronic equipment 200. Also, the order in which the layers 10 through 50 are arranged can be adjusted to control the propagation distance of the RF signals transmitted or received by the electronic equipment 200.

In one exemplary embodiment, the wave-absorbing layer 10, the first metal layer 20, the conductive fabric layer 30, the second metal layer 40, and the third metal layer 50 are combined to form an integral structure.

In one exemplary embodiment, the RF signal can be a WiFi signal or a Bluetooth signal. The electronic equipment 200 can comprise a WiFi module (not shown) and a Bluetooth module (not shown). The box body 101 comprises the foam layer, the copper foil layer, the nickel-plated conductive fabric layer, the aluminum foil layer, and the iron sheet layer, in that order from inside to outside for example. The electronic equipment 200 is set in the shielding box 100 to test a shielding effect of the shielding box 100. A WiFi hotspot (not shown) and a Bluetooth controller (not shown)

are set outside of the shielding box 100. When the electronic equipment 200 attempts to connect to the WiFi hotspot and the Bluetooth controller, the WiFi hotspot and the Bluetooth controller can be moved to obtain a first connecting distance between the electronic equipment 200 and the WiFi hotspot and a second connecting distance between the electronic equipment 200 and the Bluetooth controller.

In one exemplary embodiment, the first connecting distance is 3 meters and the second connecting distance is 0.7 meter.

In one exemplary embodiment, the WiFi hotspot and the Bluetooth controller also can be wrapped in a conductive fabric.

Figure 3:
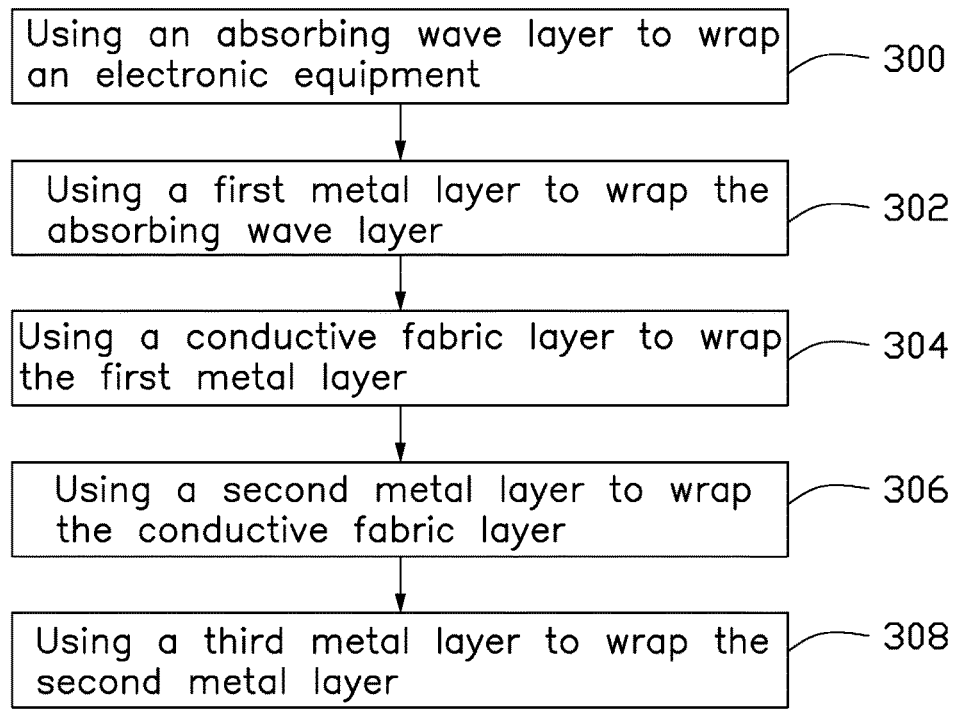
FIG. 3 is a flow diagram of an exemplary embodiment of an RF signal attenuation method.

FIG. 3 illustrates one exemplary embodiment of an RF signal attenuation method. The flowchart presents an exemplary embodiment of the method. The exemplary method is provided by way of example, as there are a variety of ways to carry out the method. Each step shown in FIG. 3 may represent one or more processes, methods, or subroutines, carried out in the example method. Furthermore, the illustrated order of steps is illustrative only and the order of the steps can change. Additional steps can be added or fewer steps may be utilized, without departing from this disclosure. The example method can begin at step 300.

In step 300, the wave-absorbing layer 10 wraps the electronic equipment 200.

In step 302, the first metal layer 20 wraps the wave-absorbing layer 10.

In step 304, the conductive fabric layer 30 wraps the first metal layer 20.

In step 306, the second metal layer 40 wraps the conductive fabric layer 30.

In step 308, the third metal layer 50 wraps the second metal layer 40.

In one exemplary embodiment, the first metal layer 20, the second metal layer 40, and the third metal layer 50 comprise metal materials of different types.

In one exemplary embodiment, the wave-absorbing layer 10 can be the foam layer, the first metal layer 20 can be the copper foil layer, the second metal layer 40 can be the aluminum foil layer, and the third metal layer 50 can be the iron sheet layer.

In one exemplary embodiment, the first metal layer 20 can be the aluminum foil layer and the second metal layer 40 can be the copper foil layer.

In one exemplary embodiment, the conductive fabric layer 30 can be the nickel-plated conductive fabric layer, the gold-plated conductive fabric layer, or the carbon-plated conductive fabric layer.

In one exemplary embodiment, the wave-absorbing layer 10, the first metal layer 20, the conductive fabric layer 30, the second metal layer 40, and the third metal layer 50 form an integral structure.

The exemplary embodiments shown and described above are only examples. Many such details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will therefore be appreciated that the exemplary embodiments described above may be modified within the scope of the claims.

What is claimed is:

1. A shielding box comprising:
a box body comprising a wave-absorbing layer, a first metal layer, a conductive fabric layer, a second metal layer, and a third metal layer from inside to outside in that order.

2. The shielding box of claim 1, wherein the first metal layer, the second metal layer, and the third metal layer comprise metal materials of types which are different from one another.

3. The shielding box of claim 2, wherein the wave-absorbing layer is a foam layer, the first metal layer is a copper foil layer, the second metal layer is an aluminum foil layer, and the third metal layer is an iron sheet layer.

4. The shielding box of claim 2, wherein the wave-absorbing layer is a foam layer, the first metal layer is an aluminum foil layer, the second metal layer is a copper foil layer, and the third metal layer is an iron sheet layer.

5. The shielding box of claim 1, wherein the wave-absorbing layer, the first metal layer, the conductive fabric layer, the second metal layer, and the third metal layer form an integral structure.

6. A radio frequency (RF) signal attenuation method for controlling a transmission distance of the RF signal of an electronic equipment, the RF signal attenuation method comprising:
using a wave-absorbing layer to wrap the electronic equipment;
using a first metal layer to wrap the wave-absorbing layer;
using a conductive fabric layer to wrap the first metal layer;
using a second metal layer to wrap the conductive fabric layer; and
using a third metal layer to wrap the second metal layer.

7. The RF signal attenuation method of claim 6, wherein the first metal layer, the second metal layer, and the third metal layer comprise metal materials of types which are different from one another.

8. The RF signal attenuation method of claim 7, wherein the wave-absorbing layer is a foam layer, the first metal layer is a copper foil layer, the second metal layer is an aluminum foil layer, and the third metal layer is an iron sheet layer.

9. The RF signal attenuation method of claim 7, wherein the wave-absorbing layer is a foam layer, the first metal layer is an aluminum foil layer, the second metal layer is a copper foil layer, and the third metal layer is an iron sheet layer.

10. The RF signal attenuation method of claim 6, wherein the wave-absorbing layer, the first metal layer, the conductive fabric layer, the second metal layer, and the third metal layer form an integral structure.

11. A radio frequency (RF) signal attenuation system comprising:
a shielding box comprising a box body; and
an electronic equipment set in the shielding box;
wherein the box body comprises a wave-absorbing layer, a first metal layer, a conductive fabric layer, a second metal layer, and a third metal layer from inside to outside in that order.

12. The RF signal attenuation system e of claim 11, wherein the first metal layer, the second metal layer, and the third metal layer comprise metal materials of types which are different from one another.

13. The RF signal attenuation system of claim 12, wherein the wave-absorbing layer is a foam layer, the first metal layer is a copper foil layer, the second metal layer is an aluminum foil layer, and the third metal layer is an iron sheet layer.

14. The RF signal attenuation system of claim 12, wherein the wave-absorbing layer is a foam layer, the first metal layer is an aluminum foil layer, the second metal layer is a copper foil layer, and the third metal layer is an iron sheet layer.

15. The RF signal attenuation system of claim 11, wherein the wave-absorbing layer, the first metal layer, the conductive fabric layer, the second metal layer, and the third metal layer from an integral structure.

* * * * *